May 29, 1956 H. W. LEVERENZ 2,748,041

SEMICONDUCTOR DEVICES AND THEIR MANUFACTURE

Filed Aug. 30, 1952

INVENTOR.
HUMBOLDT W. LEVERENZ

BY J. L. Whittaker
ATTORNEY

United States Patent Office 2,748,041

Patented May 29, 1956

2,748,041

SEMICONDUCTOR DEVICES AND THEIR MANUFACTURE

Humboldt W. Leverenz, Princeton, N. J., assignor to Radio Corporation of America, a corporation of Delaware Application August 30, 1952, Serial No. 307,231

The terminal 15 years of the term of the patent to be granted has been disclaimed 1 Claim. (Cl. 148—33)

This invention relates generally to semiconductor devices and particularly to improved methods and means for fabricating junction type semiconductor devices.

In junction type semiconductor devices, a high impedance rectifying barrier is produced by a relatively low melting point impurity material alloyed and diffused with a wafer of suitably prepared semiconductor material, such as germanium, silicon, or the like. The impurity material is chosen such that, as an impurity in a semiconductor material of a given type conductivity, the local region of the semiconductor wherein the materials are alloyed and diffused yields the opposite type of conductivity. For example, either indium, gallium, aluminum, or boron, when alloyed and diffused into an N-type semiconductor imparts to the region penetrated P-type conductivity. In a like manner, the penetration of a P-type semiconductor by an impurity material such as phosphorus, arsenic, antimony, or bismuth imparts N-type conductivity to the semiconductor.

The elements of a typical semiconductor device such as a transistor include a base electrode, and emitter and collector electrodes. As a typical example, the base electrode may comprise a conductive element connected to one surface of a wafer of N-type germanium while the emitter and collector electrodes may each comprise similar conductive elements connected to a disk or pellet of indium diffused and alloyed into each of two opposite faces of the germanium wafer. This is known as a P–N–P type device. In the fabrication of such devices, it is necessary that these electrodes be provided with terminal leads for connecting the device to an electrical circuit or to a suitable socket which, in turn, may be plugged into a circuit.

One disadvantage of the type of semiconductor device described above arises from the method of manufacture of such a device and the unadaptability of this method to mass production operation. Since two disks of impurity material are diffused, the progress of each must be controlled and, in effect, two operations are performed. In addition, the diffusion must be carefully controlled since the degree of diffusion and the resultant internal spacing of the diffused substances are quite critical and must be held within comparatively narrow limits.

Accordingly, the principal object of this invention is to provide an improved semiconductor device and method of preparing the same.

A further object is to provide an improved method of manufacturing a semiconductor device having a plurality of emitter and collector portions.

Another object is to provide a method of manufacture of a semiconductor device in which the spacing between emitter and collector portions is easily controlled.

A further object is to provide an improved method of manufacturing semiconductor devices, said method being adaptable for mass production operation.

In general the purposes and objects of this invention are accomplished by alloying and diffusing a quantity of a substance into one surface of a body of semiconductor material. The substance is chosen for its ability to change the electrical properties of the semiconductor body and form a rectifying barrier and a layer of material having conductivity of a different type than that of the main semiconductor body. Next a cut or channel is made through the region containing the alloyed material and through the barrier layer formed between the alloyed region and the semiconductor body so that discrete and separate sandwiches are formed including layers of opposite type conductivity material separated by a rectifying barrier. In certain applications it may be desirable to diffuse an impurity substance on more than one surface of a semiconductor body and then divide each surface into a plurality of discrete units.

The invention is described with reference to the drawing wherein.

Figure 1:
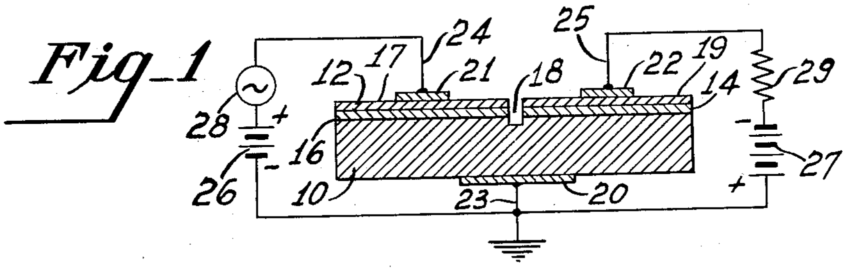
Fig. 1 shows a sectional, elevational view of a semiconductor device prepared according to the principles of the invention.

Referring to the drawing, a wafer or block 10 of semiconductor material such as germanium, silicon, or the like has a quantity of impurity substance 12 alloyed and diffused into one surface thereof to form a P–N junction. A sufficient quantity of the substance is employed to cover substantially the entire surface of the wafer. If the wafer, of germanium for example, is of N-type conductivity, the substance is selected for its ability to form, with the germanium, a layer 14 of P-type conductivity material and a rectifying barrier 16. Suitable materials providing such conductivity include indium, gallium, aluminum, boron, and the like. If the germanium has P-type conductivity the alloying substance is chosen to yield an N-type conductivity layer. Such substance may be phosphorus, arsenic, antimony, bismuth or the like.

The above-mentioned alloying and diffusion may be achieved by the following method. Initially the germanium wafer 10 is etched in a solution comprising 4 cc. of hydrofluoric acid, 2 cc. of concentrated nitric acid, and 200 milligrams of cupric nitrate in 4 cc. of water. After etching, the germanium wafer is washed with distilled water at room temperature and dried in a blast of hot air, the air being at a temperature of approximately 60° C. The disk of impurity material 12, such as indium, is placed on one side of the wafer and the ensemble is heated in a reducing atmosphere at a temperature in the range of 400° C. to 500° C. for ten to twenty minutes whereby the disk 12 is alloyed with and diffused into the germanium 10. In this operation, initially, the indium melts and alloys with the germanium. The alloying continues until the concentration of indium in germanium below the surface 12 is insufficient to cause the indium to alloy with the germanium. At this time solid diffusion occurs further increasing the depth of penetration.

According to the invention, the next step of the method comprises forming, by either mechanical or chemical means, a narrow channel 18 in the composite device formed by the alloying and diffusion process. The channel is extended through the impurity layer 12, the P-type conductivity layer 14, the barrier layer 16, and slightly into the main body of the N-type germanium wafer 10. Thus two separate and discrete portions or electrodes 17 and 19 are formed which include P-type and N-type germanium separated by a rectifying barrier layer. The process of forming the channel 18 may be carried out by means of a cutting wheel or other suitable mechanical means, preferably followed by etching, or solely by means of a chemical etching process such as the one described above.

Finally, electrode lead connections are made to complete the device and prepare it for operation. Such connections are made by soldering or otherwise mounting conductive electrode plates 20, 21, 22, of copper for example, on the free surfaces of the block 10 and the two portions or electrodes 17 and 19 of alloyed material respectively. The usual electrode leads 23, 24, 25, are then fastened to the plates 20, 21, 22 respectively. In operation of the device, the plate 20 is operated as the base electrode and the electrodes 17 and 19 are operated as emitter and collector electrodes respectively. If desired, the roles of electrodes 17 and 19 may be reversed and 19 may be operated as the emitter and 17 as the collector as is well known in the art.

In operation of the electrodes 17 as the emitter, a positive bias is applied thereto through lead 24 which is connected to the positive terminal of a battery 26. The electrode 19, as the collector, is biased negatively through lead 25 which is connected to the negative terminal of a battery 27. The negative terminal of the battery 26, the positive terminal of the battery 27 and the base electrode lead 23 are all connected to ground. A signal source 28 is schematically represented in the circuit between the battery 26 and the emitter electrode 24. A load impedance 29, across which an output signal is developed, is connected in the collector circuit between the battery 29 and the collector lead 25.

In operation of the device shown in Fig. 1 as an amplifier, the positively biased emitter electrode 21, under the influence of the signal source 28, serves as an emitter of positive charges or "holes" into the P-type layer 14. Because of the comparatively high conductivity of the material of this layer and of the much higher resistance of the rectifying barrier 16, these positive charges tend to flow away from the emitter electrode in all directions before crossing the barrier 16. Some of the charges flow into the neighborhood of the negatively biased collector electrode and are drawn to the collector under the influence of a strong electric field existing between the collector 22 and the main body 10 of N-type semiconductor material. Thus a current flows in the external circuit connected to the collector and an output voltage is developed across the load impedance 29.

Figure 2:
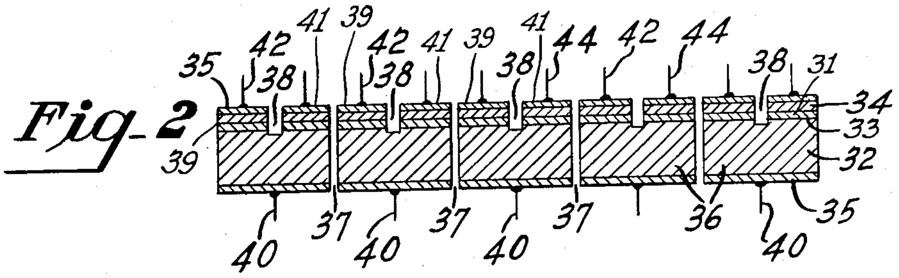
Fig. 2 shows a sectional, elevational view of one embodiment of the invention as used in mass production manufacture of semiconductor devices.

One advantage of this invention is that the principles may be applied to mass production of semiconductor devices. For example, as shown in Fig. 2, a comparatively large block of germanium 32, e. g. of N-type conductivity, has a layer of indium 34, or the like, diffused substantially completely over one surface thereof to form a P–N junction including a layer 31 of P-type material and a rectifying barrier 33. Plates of conductive material, of copper for example, are then soldered or otherwise connected, one 35 to the layer of indium 34, and one 35′ to the opposite surface of the germanium block 32. The composite body formed thereby is then divided into a plurality of individual units 36 by means of channels 37 cut therein by any suitable means. Each unit in turn has its P–N junction formed into portions or electrodes 39 and 41 respectively according to the method described above by means of narrow, shallow channels 38. These operations by which the channels 37 and 38 are formed may be reversed if desired and the channels 38 may be formed before the individual units 36 are cut from the composite body.

Electrode leads 40, 42, and 44 are then connected as by soldering to each of the separate portions of the conductive plates 35 and 35′ mounted on each of the individual units 36. In operation of each of these units, then, the plates 35′ are operated as base electrodes and the electrodes 39 and 41 may be operated as emitter and collector electrodes or vice versa.

Figure 3:
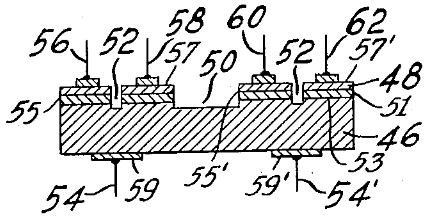
Fig. 3 shows a sectional, elevational view of another embodiment of the principles of the invention in a mass produced device; and, Fig. 4 shows a sectional, elevational view of a further modification of the invention.

In a further embodiment of the invention shown in Fig. 3, a block of N-type germanium 46 has a layer 48 of indium, or the like, alloyed and diffused into one surface thereof in the manner described above to form a P–N junction including a layer 51 of P-type material and a rectifying barrier 53. Next, a comparatively wide isolating groove 50 is cut in the alloyed layer and through the P–N junction to the main germanium body. The groove 50 effectively divides the germanium block into two separate portions. Narrow channels 52 are then cut on either side of the dividing groove through the P–N junction and into the main body of the germanium whereby two junction electrodes or portions 55, 57, 55′, 57′ are formed on each side of the groove 50. Finally, electrode leads 54, 54′ are connected to base electrodes 59, 59′ mounted on the free surface of the germanium body substantially opposite each of the pairs of diffusion junctions where they may be operated as base electrodes. Leads 56 and 58 are fastened to the subdivided portions 55, 57 on one side of the groove 50 and electrodes 60 and 62 are fastened to the subdivided portions 55′, 57′ on the other side of the groove 50. The electrodes 55 and 55′ may be operated as emitter electrodes and the electrodes 57 and 57′ as collectors or vice versa. The device shown in Fig. 3 may be mass produced by a method similar to that described with reference to Fig. 2.

Figure 4:
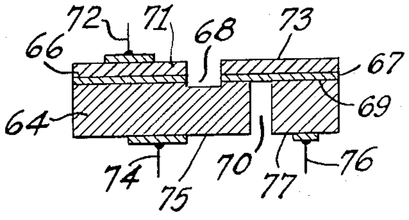

Another embodiment of the invention is shown in Fig. 4 and comprises a semiconductor device known as a P–N hook or a P–N–P–N transistor. The device consists of a block of germanium 64 for example of N-type conductivity and a layer of indium 66 diffused over one surface thereof to form a P–N junction including a P-type layer 67 and a rectifying barrier 69. According to the invention, a single channel 68 is cut through the P–N junction into the semiconductor body substantially at the center thereof to form portions 71 and 73 and another channel 70 is cut through the main body of the semiconductor body on one side of the channel 68 and extending to the indium layer to form portions 75 and 77. An electrode lead 72 is connected to one of the P–N junction portions, e. g. 71, and electrode leads 74 and 76 are connected to each of the portions 74, 76 of the main semiconductor body. In operation of the device shown, the portions 71, 75, and 77 may be operated as the emitter, base, and collector electrodes respectively. This embodiment of the invention may also be manufactured by a mass production method similar to that described above in relation to Fig. 2.

In all of the embodiments described above, it is to be understood that where N-type and P-type germanium are shown, the reverse conductivities may be employed with the usual changes in bias voltages.

What is claimed is:

A semiconductor device comprising a block of semiconductor material of one type of conductivity, a layer of a substance alloyed and diffused into one surface of said block whereby a rectifying barrier and a layer of material of opposite conductivity are formed within said surface and adjacent to the main body of said block in the order named, a channel formed in said alloyed layer and extending through said layer of opposite conductivity material and said rectifying barrier whereby a plurality of diffusion junctions are formed, and another channel formed in the main body of said block and extending up to said layer of alloyed material whereby two portions of said semiconductor block are formed.

References Cited in the file of this patent

UNITED STATES PATENTS

| | | |
|---|---|---|
| 2,402,661 | Ohl | June 25, 1946 |
| 2,561,411 | Pfann | July 24, 1951 |
| 2,595,497 | Webster | May 6, 1952 |
| 2,603,693 | Kircher | July 15, 1952 |
| 2,612,567 | Stuetzer | Sept. 30, 1952 |
| 2,629,672 | Sparks | Feb. 24, 1953 |
| 2,655,625 | Burton | Oct. 13, 1953 |
| 2,663,806 | Darlington | Dec. 22, 1953 |
| 2,667,607 | Robinson | Jan. 26, 1954 |
| 2,673,948 | Matare et al. | Mar. 30, 1954 |